(12) United States Patent
Kwon et al.

(10) Patent No.: US 11,908,810 B2
(45) Date of Patent: Feb. 20, 2024

(54) HYBRID SEMICONDUCTOR DEVICE AND ELECTRONIC DEVICE

(71) Applicant: SAMSUNG ELECTRONICS CO., LTD., Suwon-si (KR)

(72) Inventors: Heungkyu Kwon, Seongnam-si (KR); Junso Pak, Seongnam-si (KR); Heeseok Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 233 days.

(21) Appl. No.: 17/489,328

(22) Filed: Sep. 29, 2021

(65) Prior Publication Data

US 2022/0181274 A1 Jun. 9, 2022

(30) Foreign Application Priority Data

Dec. 3, 2020 (KR) .................. 10-2020-0167328

(51) Int. Cl.
*H01L 23/16* (2006.01)
*H01L 23/00* (2006.01)

(52) U.S. Cl.
CPC ............ *H01L 23/562* (2013.01); *H01L 23/16* (2013.01)

(58) Field of Classification Search
None
See application file for complete search history.

(56) References Cited

U.S. PATENT DOCUMENTS

| | | | |
|---|---|---|---|
| 8,643,163 B2 | 2/2014 | Shim et al. | |
| 9,666,559 B2 | 5/2017 | Wang et al. | |
| 9,748,157 B1 | 8/2017 | Chi et al. | |
| 10,685,948 B1 | 6/2020 | Zhong et al. | |
| 11,600,595 B2 * | 3/2023 | Shih | H01L 23/4827 |
| 11,688,665 B2 * | 6/2023 | Eid | H01L 23/473 |
| | | | 257/713 |
| 2009/0146315 A1 * | 6/2009 | Shim | H01L 25/105 |
| | | | 257/E21.705 |
| 2016/0071818 A1 * | 3/2016 | Wang | H01L 24/49 |
| | | | 257/773 |
| 2019/0057880 A1 | 2/2019 | Song et al. | |
| 2020/0020624 A1 | 1/2020 | Kang et al. | |
| 2020/0168528 A1 | 5/2020 | Cheah et al. | |
| 2020/0227356 A1 | 7/2020 | Belonio, Jr. et al. | |

* cited by examiner

*Primary Examiner* — Bo B Jang
(74) *Attorney, Agent, or Firm* — Fish & Richardson P.C.

(57) ABSTRACT

A hybrid semiconductor device includes an interposer substrate, a semiconductor package mounted on the interposer substrate, a molding member on the package substrate covering at least a portion of the semiconductor chip and exposing an upper surface of the semiconductor chip, and a stiffener disposed on an upper surface of the interposer substrate substantially around the semiconductor package.

20 Claims, 14 Drawing Sheets

HYBRID SEMICONDUCTOR DEVICE AND ELECTRONIC DEVICE

CROSS-REFERENCE TO RELATED APPLICATION

This application claims priority under 35 U.S.C. § 119 to Korean Patent Application No. 10-2020-0167328 filed on Dec. 3, 2020 in the Korean Intellectual Property Office, the subject matter of which is hereby incorporated by reference.

BACKGROUND

1. Field

The inventive concept relates generally to hybrid semiconductor devices and electronic devices including same. More particularly, the inventive concept relates to hybrid semiconductor devices including a ball grid array (BGA) package on which a semiconductor chip may be mounted, as well as electronic devices including same.

2. Description of the Related Art

A BGA package may be used as a chip-related component of an electronic device, such as a high-performance computing system (HPC), a network system, an automotive component, etc. Conventional System-On-Chip (SOC) packages are often characterized by a relatively thick and expensive Printed Circuit Board (PCB) substrate that provides improved signal integrity. However, a need remains for a low-cost, relatively thinner BGA package structure providing high-performance signal performance.

SUMMARY

Embodiments of the inventive concept provide hybrid semiconductor devices having reduced overall thickness, and yet providing improved signal characteristics.

Embodiments of the inventive concept provide electronic devices including such hybrid semiconductor devices.

According to some embodiments, a hybrid semiconductor device includes; an interposer substrate, a semiconductor package mounted on an upper surface of the interposer substrate, the semiconductor package including a package substrate, a semiconductor chip mounted on the package substrate, and a molding member on the package substrate covering a side surface of the semiconductor chip and exposing an upper surface of the semiconductor chip, and a stiffener disposed on the interposer substrate substantially around the semiconductor package.

According to some embodiments, a hybrid semiconductor device includes; an interposer substrate, a semiconductor package disposed on an upper surface of the interposer substrate, the semiconductor package including a package substrate, a semiconductor chip mounted on the package substrate, and a molding member on the package substrate covering at least a portion of the semiconductor chip, a stiffener disposed on the interposer substrate substantially around the semiconductor package, package connection terminals disposed between a lower surface of the semiconductor package and the upper surface of the interposer substrate, and interposer connection terminals disposed on a lower surface of the interposer substrate, wherein a pitch between the package connection terminals is less than a pitch between the interposer connection terminals.

According to some embodiments, an electronic device includes; a main board, an interposer substrate disposed on the main board, a semiconductor package mounted on an upper surface of the interposer substrate, the semiconductor package including a package substrate, a semiconductor chip mounted on the package substrate, and a molding member on the package substrate covering at least a portion of the semiconductor chip, a stiffener disposed on the upper surface of the interposer substrate substantially around the semiconductor package, package connection terminals interposed between a lower surface of the semiconductor package and the upper surface of the interposer substrate, interposer connection terminals interposed between a lower surface of the interposer substrate and an upper surface of the main board, and a heat sink in thermal contact with the semiconductor package.

According to some embodiments, a hybrid semiconductor device may include an interposer substrate on which a semiconductor package as an SOC package is mounted and a stiffener arranged on the interposer substrate. The semiconductor package may be mounted and packaged on the interposer substrate via package connection terminals, and then, the interposer substrate may be mounted on a main board via interposer connection terminals.

Since the interposer substrate includes a high-density printed circuit board (HDI PCB), it may be possible to buffer a circuit width difference between the semiconductor package and the main board at low cost.

Further, a package substrate of the semiconductor package may include a coreless substrate or a core multilayer substrate. Thus, a thickness (e.g., of the number of circuit layers) of the package substrate may be reduced, the coreless substrate or the thin cored PCB may be used and passive devices may be disposed thereon, to reduce noise, improve signal integrity, improve power integrity and/or improve power distribution network (PDN) characteristics.

BRIEF DESCRIPTION OF THE DRAWINGS

The inventive concept may be more clearly understood upon consideration of the following detailed description together with the accompanying drawings. Collectively, the embodiments illustrated in FIGS. 1 to 15 are presented as examples teaching the making and use of the inventive concept.

DETAILED DESCRIPTION

Throughout the written description and drawings like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
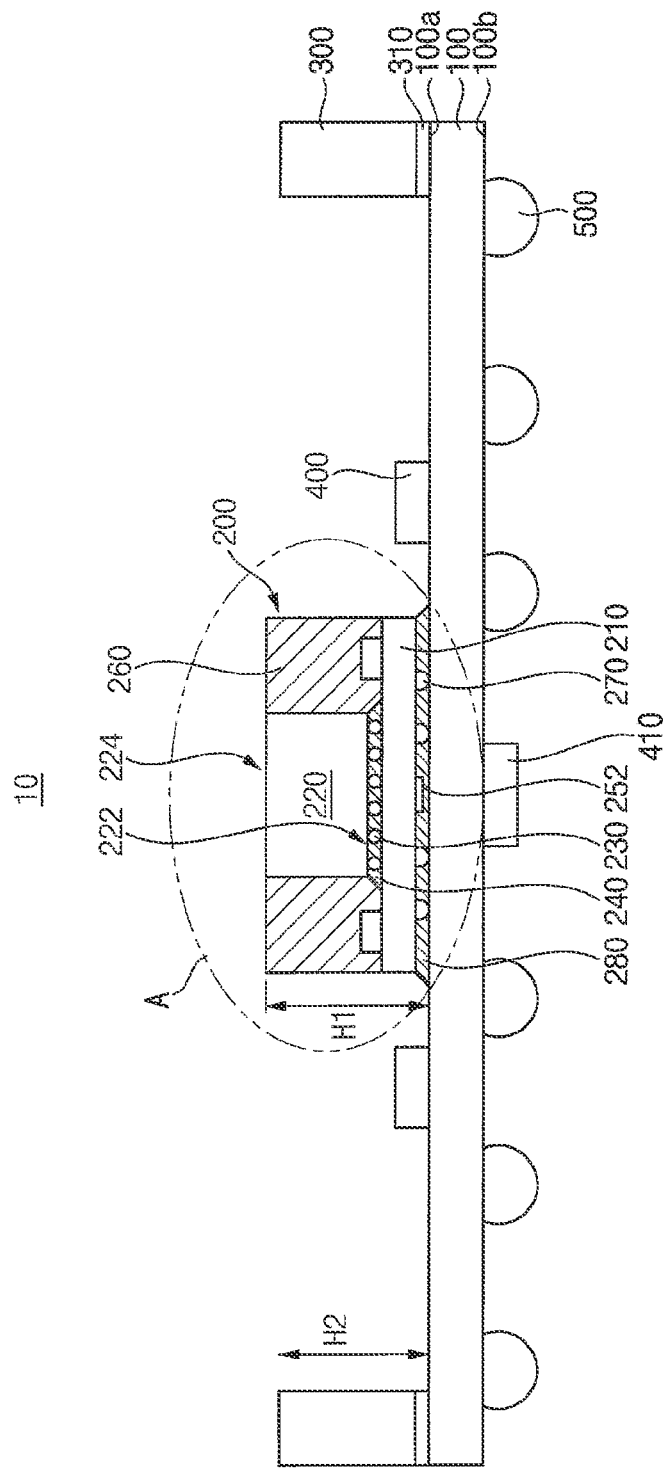
FIG. 1 is a cross-sectional view illustrating a hybrid semiconductor device 10 according to embodiments of the inventive concept.
Figure 2:
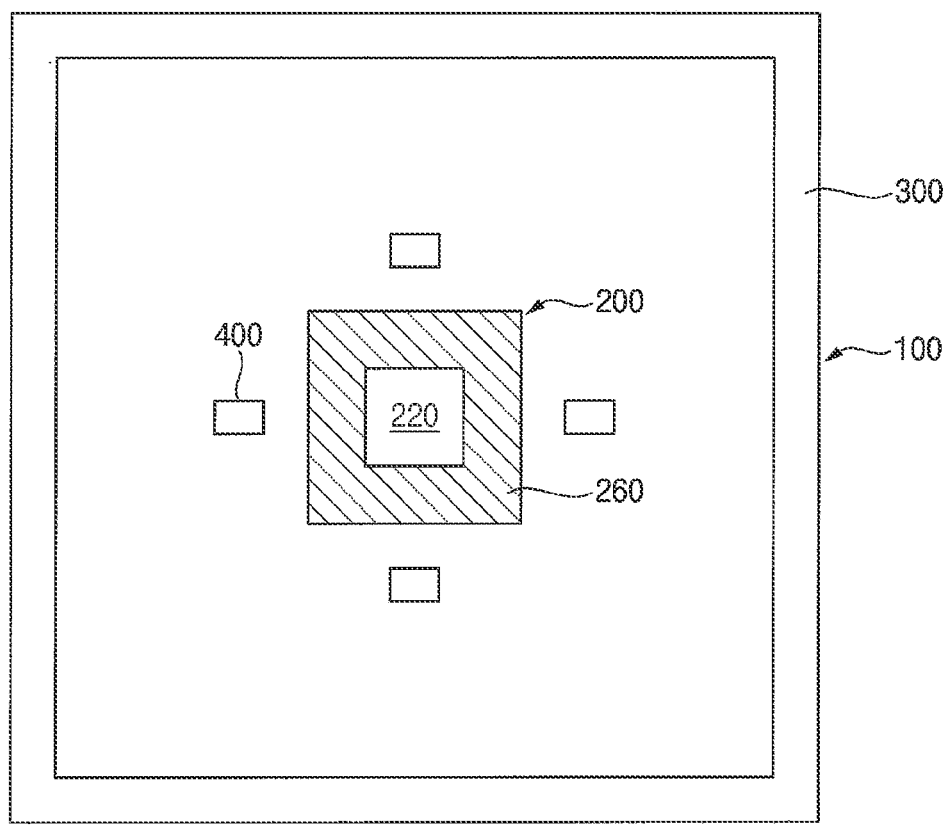
FIG. 2 is a plan (or top-down) view further illustrating the hybrid semiconductor device 10 of FIG. 1.
Figure 3:
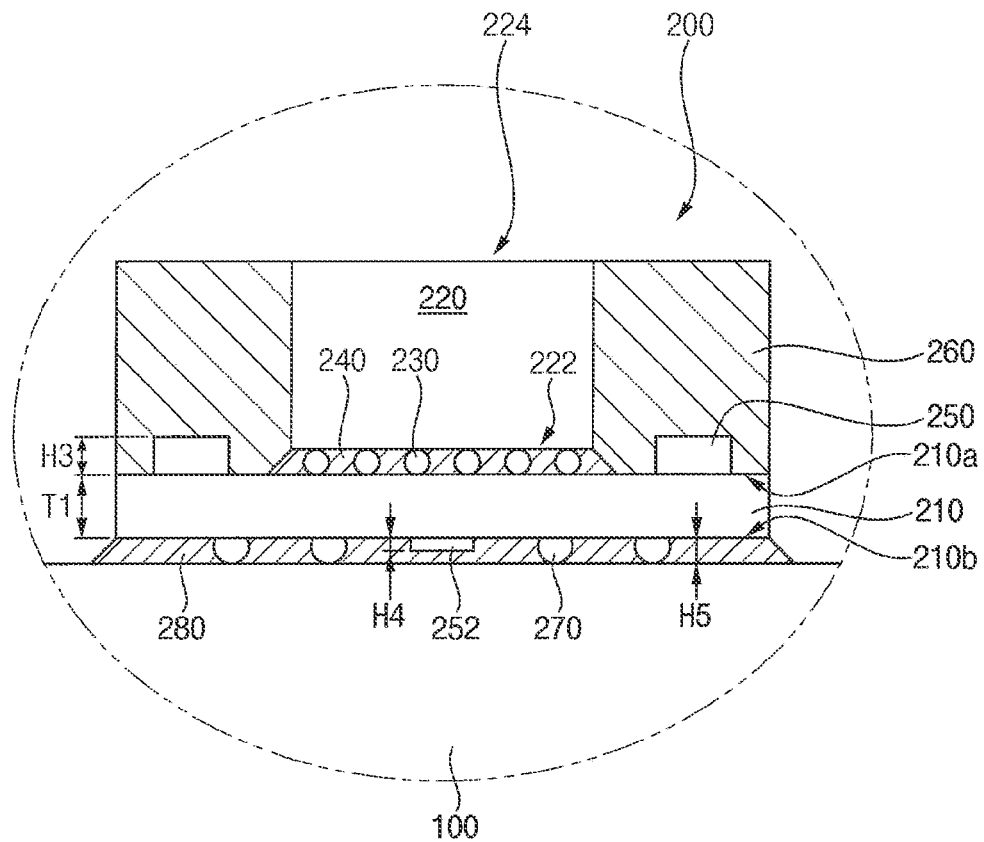
FIG. 3 is an enlarged cross-sectional view further illustrating the area 'A' indicated in FIG. 3.
Figure 4:
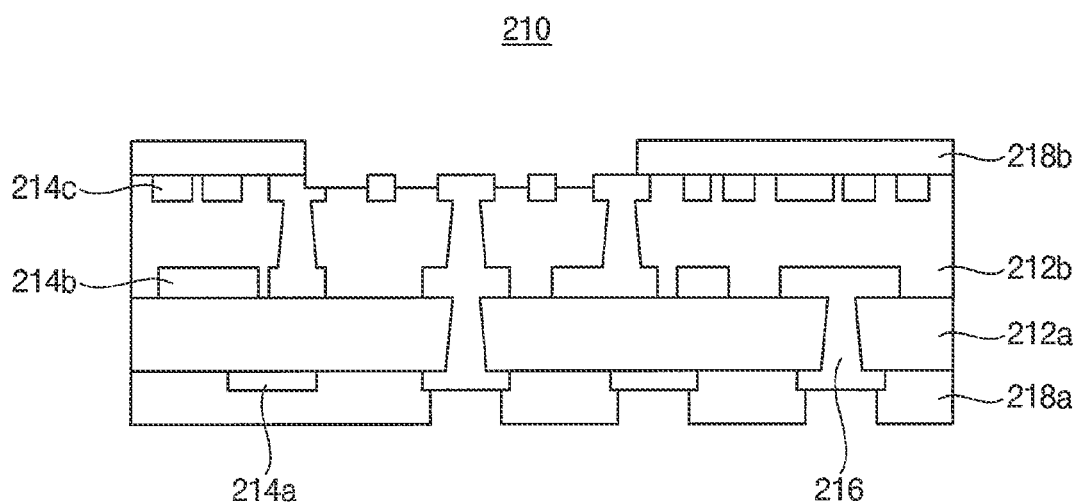
FIGS. 4 and 5 are respective, cross-sectional views further illustrating a package substrate of the semiconductor package in FIG. 3.
Figure 5:
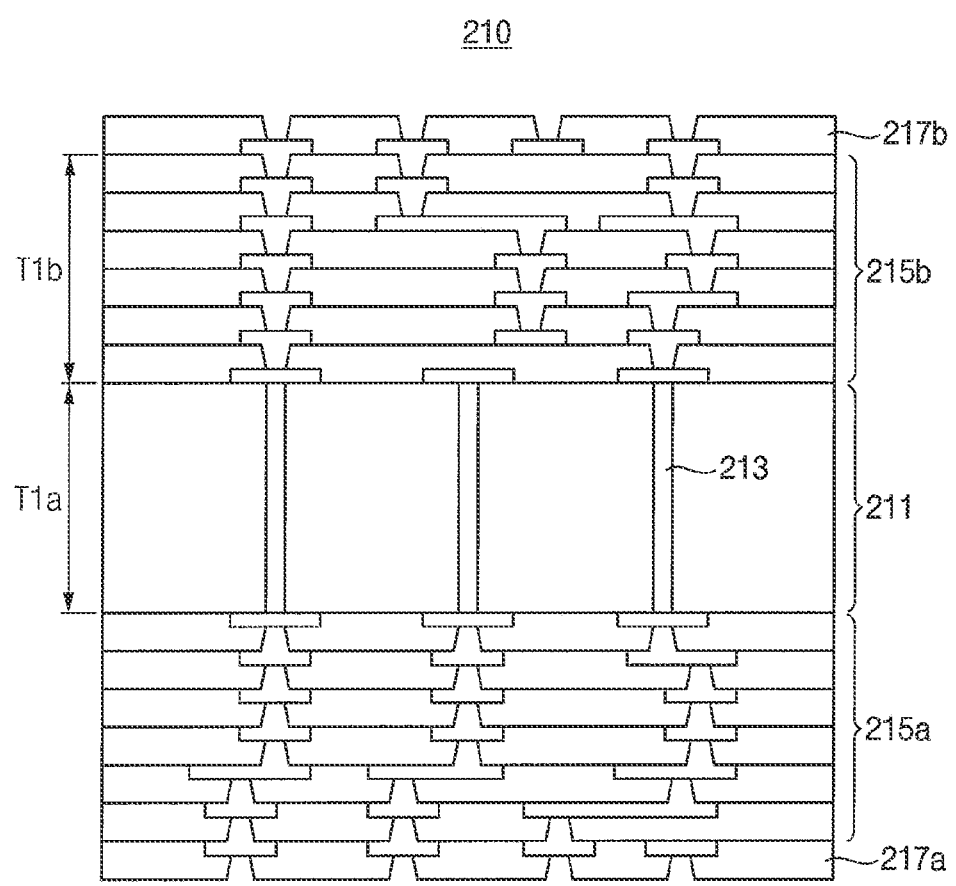

Figure (FIG. 1 is a cross-sectional view illustrating a hybrid semiconductor device 10 according to embodiments of the inventive concept, FIG. 2 is a plan view further illustrating the hybrid semiconductor device 10, FIG. 3 is an enlarged cross-sectional view further illustrating the area 'A' indicated in FIG. 3, and FIGS. 4 and 5 are respective cross-sectional views illustrating a package substrate of a semiconductor package in FIG. 3.

Referring to FIGS. 1, 2, 3, 4 and 5, the hybrid semiconductor device 10 may include an interposer substrate 100, a semiconductor package 200 mounted on the interposer substrate 100, and at least one stiffener 300 disposed on the interposer substrate 100. In some embodiments, the hybrid semiconductor device 10 may further include first passive devices 250 and 252 variously mounted on a package substrate 210 and/or second passive devices 400 and 410 variously mounted on the interposer substrate 100.

In some embodiments, the hybrid semiconductor device 10 may be physically and/or electrically connected to a main board (not shown), such as the type commonly used as chip-related components of an electronic device, such as a high performance computing system (HPC), a network system, an automotive component, etc. The semiconductor package 200 may be an SOC package as the chip-related component. In this regard, the semiconductor package 200 may include a semiconductor chip 220 such as a Central Processing Unit (CPU), a Graphics Processing Unit (GPU), an Application Specific Integrated Circuit (ASIC), a SOC, or the like.

The sizes and pitches of chip pads on the semiconductor chip 220 may be very fine, however the sizes and pitches of component mounting pads on the main board may be substantially larger. Accordingly, it may be difficult to directly mount the semiconductor chip 220 with the main board due to these size and/or pitch differences. Hence, the semiconductor package 200 including the semiconductor chip 220 may be mounted and packaged on the interposer substrate 100. Thereafter, the interposer substrate 100 including the mounted semiconductor package 200 may be more readily mounted on the main board.

In some embodiments, the semiconductor package 200 mounted on the interposer substrate 100 may include a package substrate 210, the semiconductor chip 220 mounted on the package substrate 210, and a molding member 260 covering at least the semiconductor chip 220 on the package substrate 210.

As illustrated in FIGS. 3, 4 and 5, the package substrate 210 may be provided as a substrate such as a PCB. The package substrate 210 may be a substrate having an upper surface 210a and an opposing lower surface 210b. Here, the package substrate 210 may include a coreless substrate or a core multilayered substrate.

In some embodiments, as illustrated in FIG. 4, the package substrate 210 may be the coreless substrate formed using an embedded trace substrate (ETS) method. For example, the package substrate 210 may include insulation layers 212a and 212b respectively disposed between circuit layers 214a, 214b and 214c. Protective layers 218a and 218b such as a solder resist layer may be formed on outermost (upper and/or lower) layers of the circuit layers 214a, 214b and 214c. Each of the circuit layers 214a, 214b and 214c may include circuit pattern(s), and the respective circuit pattern(s) may be electrically interconnected using through vias 216. Those skilled in the art will appreciated that a coreless substrate consistent with the foregoing description may be used as the package substrate 210, however, the scope of the inventive concept is not limited thereto.

In one example, the coreless substrate may be a nine (9) layer pattern buried coreless substrate (e.g., a 9 layer, embedded trace substrate (ETS) coreless substrate). In this case, a thickness T1 of the package substrate 210 may range from between about 40 µm to about 280 µm.

In some embodiments, as illustrated in FIG. 5, the package substrate 210 may be a core multilayered substrate. The core multilayered substrate may include a core layer 211 and circuit layers 215a and 215b stacked on upper and lower surfaces of the core layer 211. A via 213 may be formed through the core layer 211, and circuit patterns in the circuit layers 215a and 215b may be electrically interconnected by the via 213. Here, the via 213 may be formed using a laser drilling process and a copper plating process. Those skilled in the art will appreciated that a core multilayered substrate consistent with the foregoing description may be used as the package substrate 210, however, the scope of the inventive concept is not limited thereto.

In one example, the core multilayer substrate may include about nine (9) to fourteen (14) circuit layers. In this cases, a thickness T1 of the package substrate 210 may range from about 450 µm to about 550 µm, and a thickness T1a of the core layer may be about 40 µm.

In some embodiments, the semiconductor chip 220 may be mounted on the package substrate 210 using a flip chip bonding technique. Chip pads of the semiconductor chip 220 may be electrically connected to substrate pads of the package substrate 210 by conductive bumps 230. For example, a pitch between the conductive bumps 230 may range from between about 100 µm to about 150 µm. The conductive bump may include at least one conductive material, such as copper (Cu), nickel (Ni), tin (Sn), tin/silver (Sn/Ag), tin/copper (Sn/Cu), tin/indium (Sn/In), etc.

A first underfill member 240 may be disposed between the semiconductor chip 220 and the package substrate 210. In some embodiments, the first underfill member 240 may include an epoxy material. Although not illustrated, a dam structure may be arranged around the semiconductor chip 220 on the upper surface 210a of the package substrate 210, wherein the dam structure may surround the semiconductor chip 220 to prevent an underfill solution from flowing outward from the semiconductor chip 220.

First over passive devices 250 may be mounted on the upper surface 210a of the package substrate 210 using a surface mount device (SMD) process. Here, the first over passive devices 250 may include discrete capacitor(s), inductor(s) and/or resistor(s), for example. A third height H3 of the first over passive devices 250 in relation to the upper surface 210a of the package substrate 210 should be less than a height of the semiconductor chip 220.

In some embodiments, a molding member 260 may be provided on the upper surface 210a of the package substrate 210 to cover at least a portion of the semiconductor chip 220. The molding member 260 may cover four side surfaces of the semiconductor chip 220. A second surface 224 (e.g., a backside surface of the semiconductor chip 220) may be exposed by the molding member 260. In some embodiments, the second surface 224 of the semiconductor chip 220 may be coplanar with an upper surface of the molding member 260.

The molding member 260 may be formed by a dispensing process, a screen printing process, or a spin coating process. The molding member may include an epoxy-based, polyimide-based, or acrylic-based material.

In some embodiments, package connection terminals 270 may be disposed on outer connection pads on the lower surface 210b of the package substrate 210 respectively. For example, the package connection terminals 270 may include solder balls. A pitch between the package connection terminals 270 may range from between about 0.3 mm to about 0.4 mm.

First under passive devices 252 (e.g., decoupling capacitor(s)) may alternately or additionally be mounted on the lower surface 210b of the package substrate 210. A fourth height H4 for the first under passive devices 252 in relation to the lower surface 210b of the package substrate 210 should be less a fifth height H5 of the package connection terminal 270.

In some embodiments, the interposer substrate 100 may include a core multilayer substrate such as a high-density (HDI) PCB. The core multilayer substrate may include a core layer and circuit layers stacked on both upper and lower surfaces of the core layer. A via may be formed in the core layer, and circuit patterns in the circuit layers may be electrically connected to each other by the via. The via may be formed by a laser drilling process and a copper plating process. For example, the interposer substrate may have 12 to 14 circuit layers. The interposer substrate may have a thickness of 65 μm.

The semiconductor package 200 may be mounted on an upper surface 100a of the interposer substrate 100 via the package connection terminals 270. The semiconductor package 200 may be electrically connected to circuit patterns of the interposer substrate 100 by the package connection terminals 270. A second underfill member 280 may be disposed between the semiconductor package 200 and the interposer substrate 100. The second underfill member 280 may include an epoxy material.

As noted above, second passive devices 400 and 410 may be variously mounted on the upper surface 100a (as second over passive devices 400) and/or the lower surface 100b (as second under passive devices 410) of the interposer substrate 100. Here, the second passive devices 400 and 410 may be mounted on the interposer substrate 100 using a surface mount device (SMD) process, wherein a height of the second over passive devices 400 relative to the upper surface 100a of the interposer substrate 100 should be less than a height of the semiconductor package 200.

In some embodiments, a stiffener 300 may at least partially surround the semiconductor package 200 and be disposed on the interposer substrate 100. For example, the stiffener 300 may be attached on the upper surface 100a of the interposer substrate 100 using an adhesive 310. In some embodiments, the stiffener 300 may include a heat slug.

In some embodiments like the one illustrated in FIG. 2, the stiffener 300 may be a four-walled structure completely surrounding the semiconductor package 200 and arranged in a peripheral region of the interposer substrate 100. Here, the four-walled structure may prevent warpage of the interposer substrate 100.

Interposer connection terminals 500 may be disposed on outer connection pads on a lower surface 100b of the interposer substrate 100. For example, the interposer connection terminals 500 may include solder balls. A pitch between the interposer connection terminals 500 may range between about 0.65 mm to about 0.8 mm Thus, the pitch between the interposer connection terminals 500 may be at least twice the pitch between the package connection terminals 270.

The second under passive devices 410 (e.g., decoupling capacitor(s)) may be mounted on the lower surface 100b of the interposer substrate 100. A height of the second under passive devices 410 relative to the lower surface 100b of the interposer substrate 100 should be less than a height of the interposer connection terminal 500.

Hence, as noted above, the hybrid semiconductor device 10 of FIG. 1 may include the interposer substrate 100 on which the semiconductor package 200 as an SOC package is mounted, and the stiffener 300 as a reinforcing member disposed on the interposer substrate 100. The semiconductor package 200 may be mounted and packaged on the interposer substrate 100, and then mounted on a main board as a chip-related component of an electronic device.

The semiconductor package 200 may be mounted on the interposer substrate 100 via the package connection terminals 270, and the interposer substrate 100 may be mounted on the main board via the interposer connection terminals 500. The pitch between the package connection terminals 270 may be less than the pitch between the interposer connection terminals 500. The pitch between the interposer connection terminals 500 may be at least twice the pitch between the package connection terminals 270. Since the interposer substrate 100 includes an HDI PCB, it may be possible to buffer a circuit width difference between the semiconductor package 200 and the main board at low cost.

Further, the package substrate 210 of the semiconductor package 200 may include a coreless substrate or a core multilayer substrate. The first thickness T1 of the package substrate may range from about 40 μm to about 280 μm. By comparison, the thickness of package substrates in conventional SOC packages may be about 800 μm. The pitch between the package connection terminals 270 of the semiconductor package 200, that is, the solder balls may range from between about 0.3 mm to about 0.4 mm By comparison, the pitch between the solder balls in conventional SOC packages may be about 0.65 mm.

Thus, the overall thickness (e.g., including a number of circuit layers) of the package substrate 210 may be reduced. A coreless substrate or the thin cored PCB may be used. And yet various first and second passive devices may be disposed (and incorporated in design) to reduce noise, improve signal integrity, improve power integrity, and/or improve power distribution network (PDN) characteristics.

Furthermore, the molding member 260 of the semiconductor package 200 may expose the backside surface 224 of the semiconductor chip 220, yet cover the side surfaces of the semiconductor chip 220 to protect the semiconductor chip 220 from mechanical impacts and improve heat dissipation.

Furthermore, the stiffener 300 may be disposed in a peripheral region of the interposer substrate 100, thereby fully exposing the semiconductor package 200 to improve heat dissipation of the semiconductor package 200.

Hereinafter, a method of manufacturing the hybrid semiconductor device 10 of FIG. 1 will be described in relation to FIGS. 6 to 13.

Figure 6:
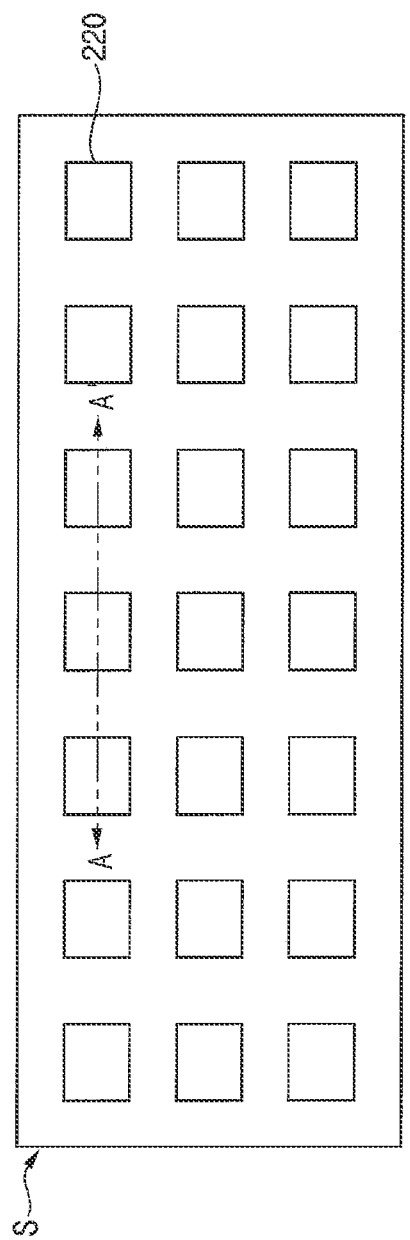
FIGS. 6, 7, 8, 9, 10, 11, 12 and 13 (hereafter collectively, "FIGS. 6 to 13") are related views illustrating in one example a method of manufacturing a hybrid semiconductor device according to embodiments of the inventive concept.
Figure 7:
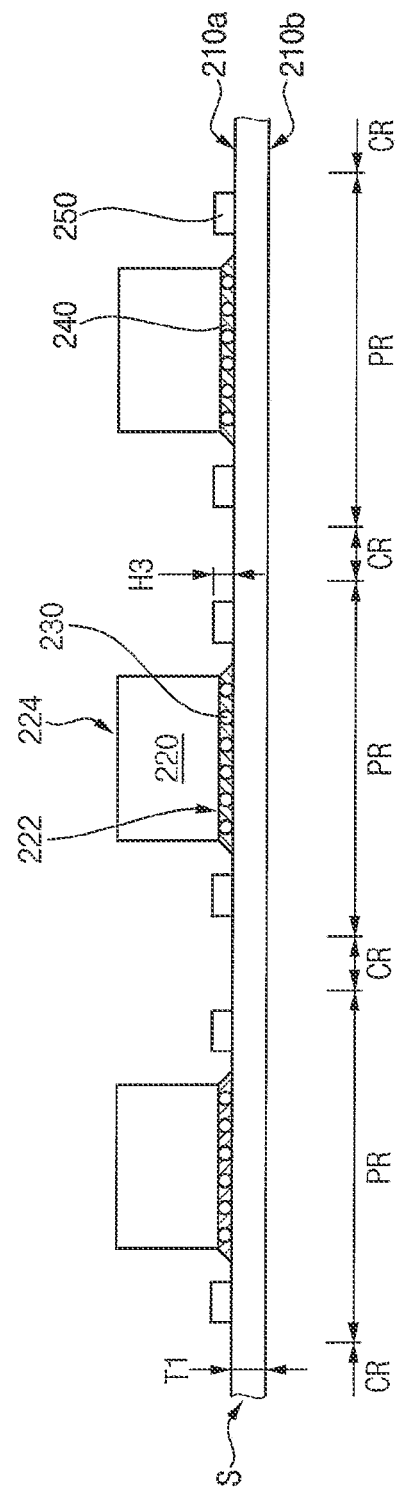

FIG. 6 is a plan view of a strip substrate S including multiple semiconductor chips 220, and FIG. 7 (like FIGS. 8, 9 and 10) is a cross-sectional view taken along the line A-A' in FIG. 6.

Referring to FIGS. 6 and 7, the strip substrate S may be provided as a substrate such as a printed circuit board (PCB) on which semiconductor package processes are performed. The strip substrate S may include a number of package regions PR in which a semiconductor chip is mounted, and a pattern of cutting regions CR surrounding each package region PR. As described hereafter, the strip substrate S may be cut along the cutting region CA to separate (e.g., singulate) the package regions PR into individual package substrates later incorporated into individual semiconductor packages. Here, each package region MR may have an area greater than or equal of (21.25 mm×21.25 mm).

The strip substrate S may be a substrate having an upper surface 210a and an opposing lower surface 210b. The strip substrate S may include a coreless substrate or a core multilayered substrate.

The coreless substrate may be formed using an embedded trace substrate (ETS) method. When the semiconductor package is provided for an electronic device, the coreless substrate may be (e.g.) a 9 layer pattern buried coreless substrate (e.g., a 9 layer ETS coreless substrate). In this case, the first thickness T1 of the package substrate 210 may range from between about 220 μm to about 280 μm.

The core multilayer substrate may include a core layer and circuit layers stacked on both upper and lower surfaces of the core layer. A via may be formed in the core layer, and circuit patterns in the circuit layers may be electrically connected to each other by the via. The via may be formed by a laser drilling process and a copper plating process. In this case, the first thickness T1 of the package substrate 210 may range from between about 450 μm to about 550 μm. That is, the core layer may have a thickness of about 40 μm, and may have 9 to 14 circuit layers.

In some embodiments, the semiconductor chip 220 may be mounted on the strip substrate S using a flip chip bonding technique. Chip pads of the semiconductor chip 220 may be electrically connected to substrate pads of the strip substrate S by conductive bumps 230. For example, a pitch between the conductive bumps 230 may range from between about 100 μm to about 150 μm.

Thus, after forming the conductive bumps 230 the chip pads on a backside surface 222 (e.g., an active surface of the semiconductor chip 220), multiple semiconductor chips 220 may be disposed on the strip substrate S in a matrix using the conductive bumps 230. In this case, the conductive bumps 300 may be disposed on the substrate pads on the strip substrate S, respectively. Then, the conductive bumps 300 may be attached onto the substrate pads using a reflow process to mount the semiconductor chip 220 on the strip substrate S.

Here, the conductive bump may include at least one conductive material, such as copper (Cu), nickel (Ni), tin (Sn), tin/silver (Sn/Ag), tin/copper (Sn/Cu), tin/indium (Sn/In), etc.

The first underfill member 240 may be disposed (i.e., underfilled) between the semiconductor chip 220 and the strip substrate S. The first underfill member 240 may include an epoxy material. For example, an underfill solution may be injected between the semiconductor chip 220 and the strip substrate S using a dispenser nozzle. The underfill solution may move between the semiconductor chip 220 and the strip substrate S by a capillary phenomenon, and then may be cured to form the first underfill member 240. Alternatively, the first underfill member may be formed together with a molding member by performing a molded underfill (MUF) process using a mold apparatus for forming the molding member as described later.

Although it is not illustrated in FIG. 7, a dam structure may be disposed around the semiconductor chip 220 on the upper surface 210a of the strip substrate S. The dam structure may extend along a circumference of the semiconductor chip 220 to prevent the underfill solution from flowing outward from the semiconductor chip 220.

In some embodiments, the first over passive devices 250 may be mounted on the upper surface 210a of the strip substrate S. The first over passive devices 250 may be mounted on the strip substrate S using a surface mount device (SMD) process. For example, the first over passive devices may include capacitor(s), inductor(s), and/or resistor(s). The third height H3 of the first over passive device 250 relative to the upper surface 210a of the strip substrate S may be less than a height of the semiconductor chip 220.

Figure 8:
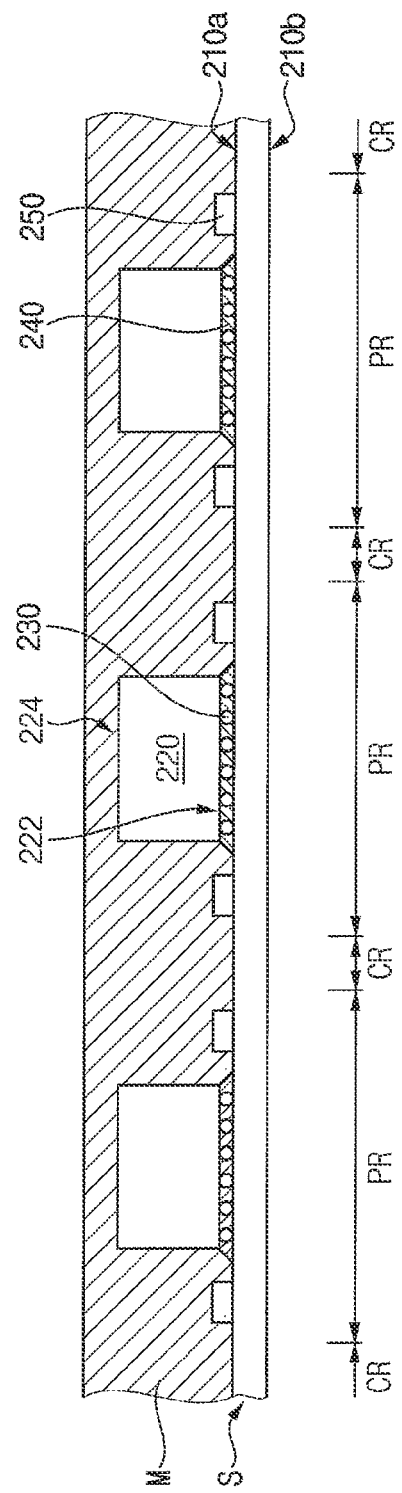
Figure 9:
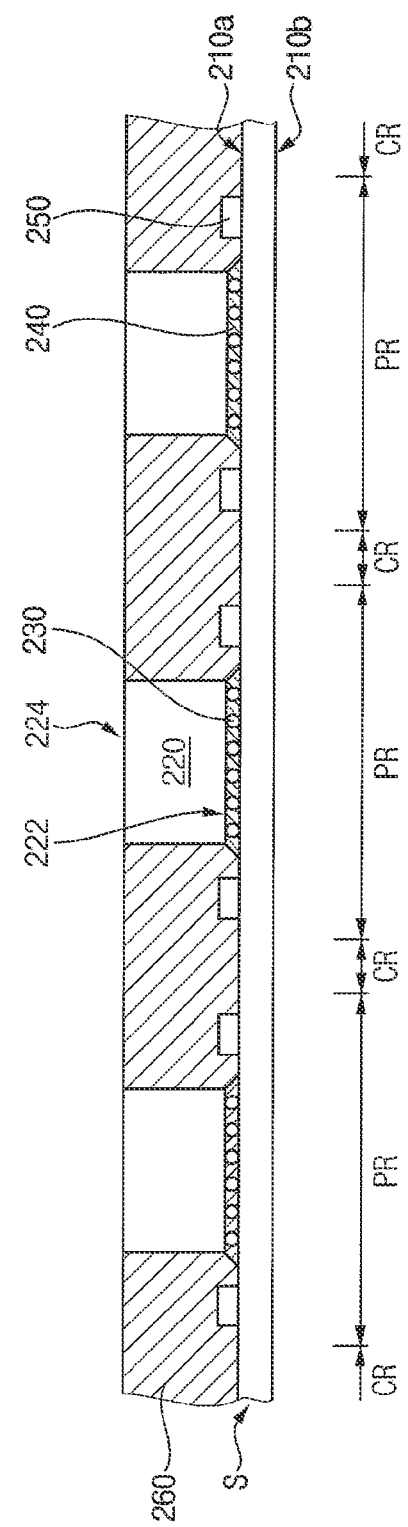

Referring to FIGS. 8 and 9, the molding member 260 covering at least a portion of the semiconductor chip 220 may be formed on the upper surface 210a of the strip substrate S.

First, after forming a molding material M covering the semiconductor chip 220 on the strip substrate S, an upper portion of the molding material M may be removed to form the molding member 260 exposing a second surface 224, i.e., a backside surface of the semiconductor chip 220.

The molding member 260 may cover four side surfaces of the semiconductor chip 220. The second surface 224 of the semiconductor chip 220 may be exposed by the molding member 260. The second surface 224 of the semiconductor chip 220 may be coplanar with the upper surface of the molding member 260.

The molding member 260 may be formed by a dispensing process, a screen printing process, or a spin coating process. The molding member may include an epoxy-based, polyimide-based, or acrylic-based material.

Figure 10:
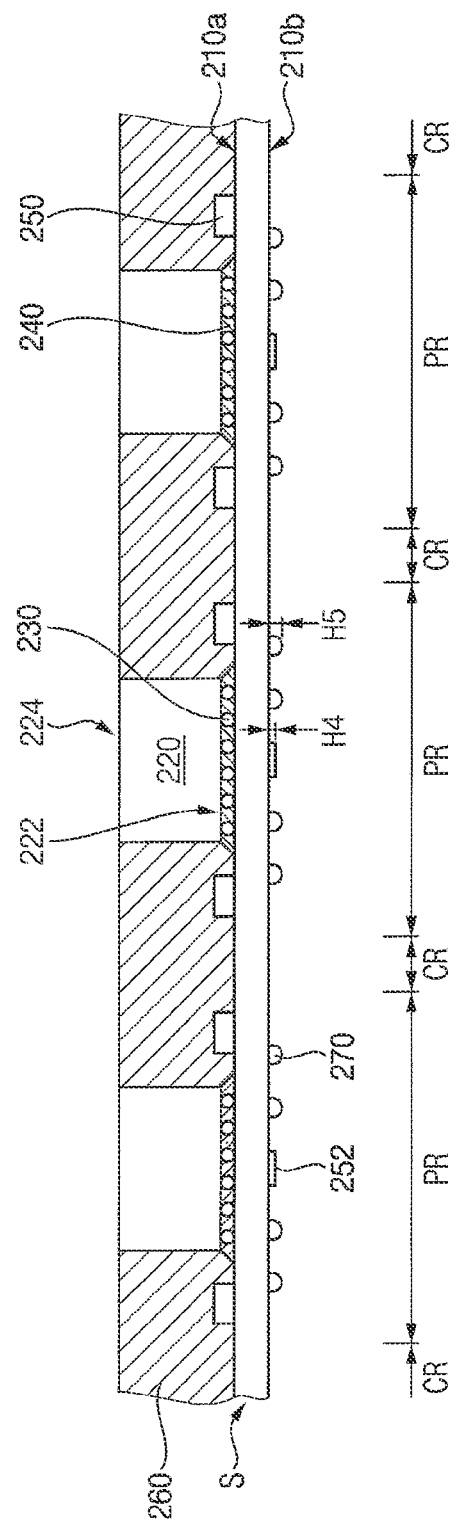

Referring to FIG. 10, package connection terminals 270 may be disposed on the lower surface 210b of the strip substrate S. For example, the package connection terminals 270 may include solder balls. A pitch between the package connection terminals 270 may a range from between about 0.3 mm to about 0.4 mm.

In some embodiments, the first under passive devices 252 (e.g., decoupling capacitor(s)) may be mounted on the lower surface 210b of the strip substrate S. The fourth height H4 of the first under passive device 252 relative to the lower surface 210b of the strip substrate S may be less than the fifth height H5 of the package connection terminal 270.

At this point in the method of manufacture, the strip substrate S may be cut along the cutting region CR to singulate individual semiconductor packages 200.

Figure 11:
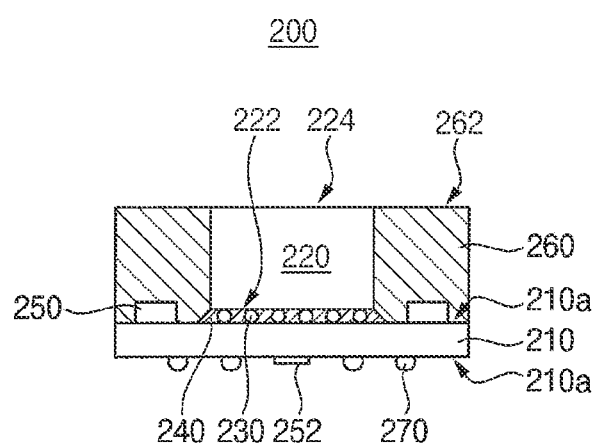

FIG. 11 is a cross-sectional view illustrating the semiconductor package 200 before it is mounted on the interposer substrate 100.

In some embodiments, the interposer substrate 100 may include a core multilayer substrate such as an HDI PCB. The core multilayer substrate may include a core layer and circuit layers stacked on both upper and lower surfaces of the core layer. A via may be formed in the core layer, and circuit patterns in the circuit layers may be electrically connected to each other by the via. The via may be formed by a laser drilling process and a copper plating process. For example, the interposer substrate may include 12 to 14 circuit layers.

Figure 12:
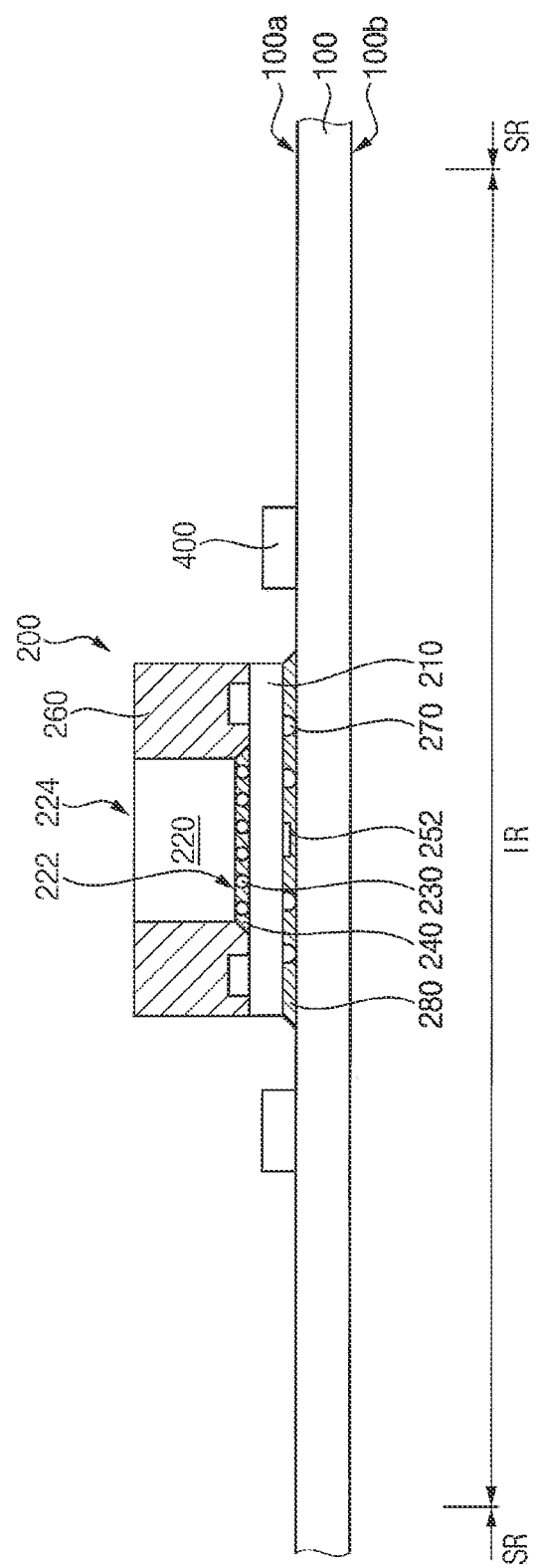

Referring to the cross-sectional view of FIG. 12, the semiconductor package 200 may be mounted on an upper surface 100a of the interposer substrate 100 using the package connection terminals 270. The semiconductor package 200 may be electrically connected to circuit patterns of the interposer substrate 100 by the package connection terminals 270.

In some embodiments, second over passive devices 400 may be mounted on the upper surface 100a of the interposer substrate 100 using a surface mount device (SMD) process. Here, a height of the second over passive devices 400 relative to the upper surface 100a of the interposer substrate 100 may be less than a height of the semiconductor package 200.

The second underfill member 280 may be disposed between the semiconductor package 200 and the interposer substrate 100. The second underfill member 280 may include an epoxy material. For example, an underfill solution may be injected between the semiconductor package 200 and the interposer substrate 100 using a dispenser nozzle. The underfill solution may be cured between the semiconductor package 200 and the interposer substrate 100 to form the second underfill member 280.

Figure 13:
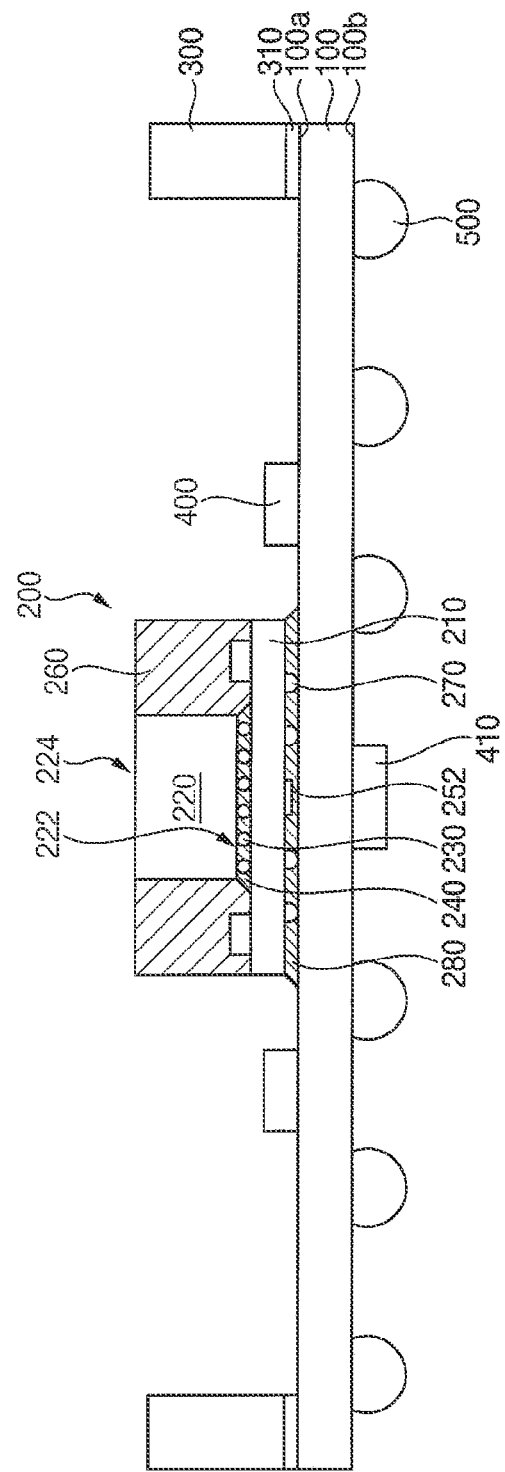

Referring to the cross-sectional view of FIG. 13, the stiffener 300 may be disposed substantially around the semiconductor package 200 on the interposer substrate 100.

In some embodiments, the stiffener 300 may be attached on the upper surface 100a of the interposer substrate 100 using an adhesive 310. The stiffener 300 may include a heat slug. The stiffener 300 may be a four-walled structure extending around a peripheral region of the interposer substrate 100 to thereby prevent warpage of the interposer substrate 100.

Interposer connection terminals 500 may be disposed on a lower surface 100b of the interposer substrate 100. For example, the interposer connection terminals 500 may include solder balls. A pitch between the interposer connection terminals 500 may range from between about 0.65 mm to about 0.8 mm.

In some embodiments, second under passive devices 410 (e.g., decoupling capacitor(s)) may be mounted on the lower surface 100b of the interposer substrate 100. A height of the second under passive devices 410 relative to the lower surface 100b of the interposer substrate 100 may be less than a height of the interposer connection terminal 500.

At this point in the method of manufacture, the interposer substrate 100 may be cut along a sawing region SR (see, FIG. 12) to form the hybrid semiconductor device of FIG. 1.

Figure 14:
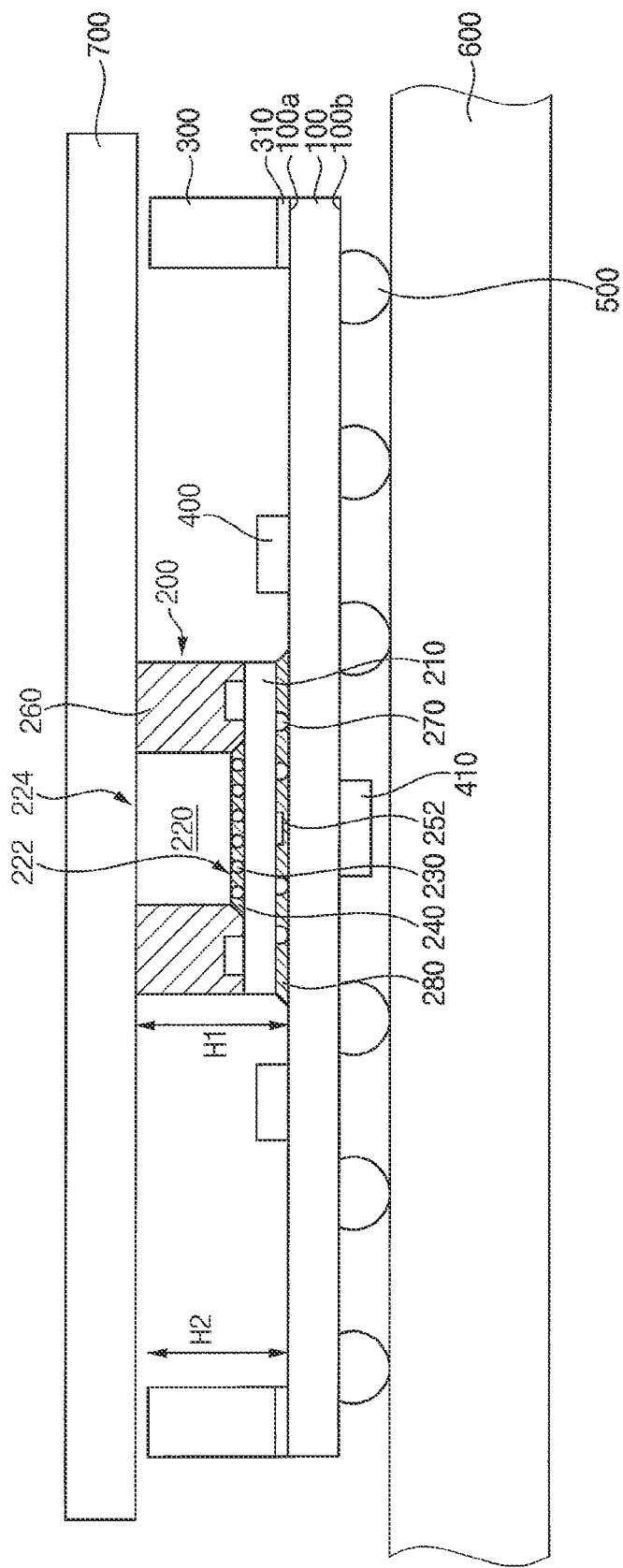
FIGS. 14 and 15 are respective, cross-sectional views illustrating electronic devices according to embodiments of the inventive concept.

FIG. 14 is a cross-sectional view illustrating an electronic device according to embodiments of the inventive concept.

Referring to FIG. 14, an electronic device may include a main board 600, a hybrid semiconductor device 10 mounted on the main board 600 and a heat sink 700 on the main board 600 in thermal contact with a semiconductor package 200 of the hybrid semiconductor device 10. The hybrid semiconductor device may be substantially the same as the hybrid semiconductor device 10 of FIG. 1.

In some embodiments, the hybrid semiconductor device 10 may be mounted on the main board 600 via interposer connection terminals 500. The semiconductor package 200 may have the first height H1 relative to the upper surface 100a of the interposer substrate 100, and the stiffener 300 may have a second height H2 relative to the upper surface 100a of the from the interposer substrate 100, wherein the first height H1 is greater than the second height H2.

The heat sink 700 may have a lower surface in thermal contact with the semiconductor package 200. The flat lower surface of the heat sink 700 may be in thermal contact with an upper surface of the semiconductor package 200 and may be spaced apart from an upper surface of the stiffener 300.

In some embodiments, during testing process(es) applied to the hybrid semiconductor device 10, a test pusher may be designed based on a relationship between the first height H1 of the semiconductor package 200 and the second height H2 of the stiffener 300 taking into account known warpage behaviors for the hybrid semiconductor device 10 and surrounding material/components.

Since the first height (H1) of the semiconductor package 200 is greater than the second height (H2) of the stiffener 300, in the case of a 'smile' warpage of the hybrid semiconductor device 10, the test pusher has a structure that the test pusher first contacts the stiffener 300 rather than the semiconductor package 200 so that the hybrid semiconductor device having the smile warpage may be spread out during the test. In contrast, in the case of crying warpage of the hybrid semiconductor device 10, the test pusher is designed to contact the semiconductor package 200 first rather than the stiffener 300, so that the hybrid semiconductor device having the crying warpage may be spread out during the test.

Figure 15:
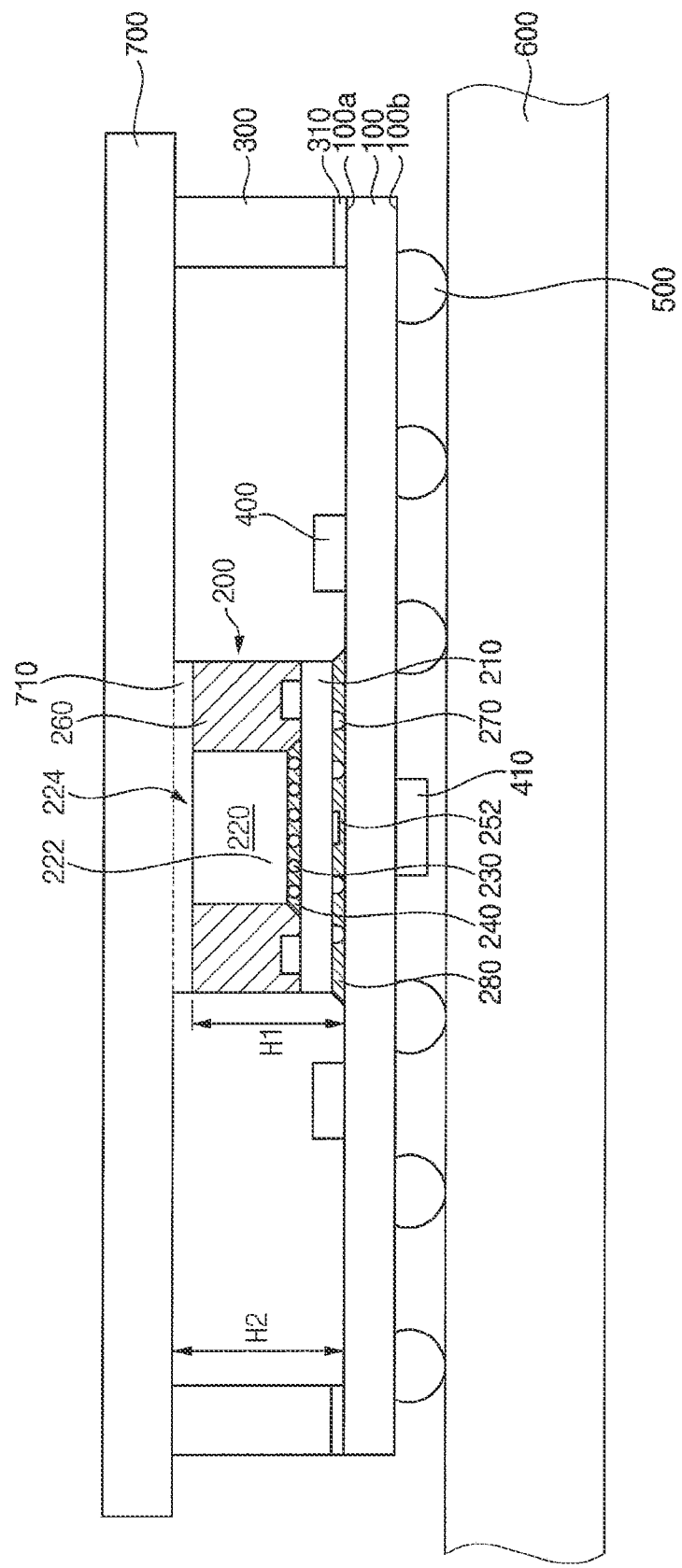

FIG. 15 is a cross-sectional view illustrating an electronic device according to embodiments of the inventive concept. Here, the electronic device may be substantially the same as the electronic device described in relation to FIG. 14, except for the structure of a heat sink.

Referring to FIG. 15, the semiconductor package 200 again has the first height H1 relative to the upper surface 100a of the interposer substrate 100, and the stiffener 300 again has the second height H2 relative to the upper surface 100a of the interposer substrate 100. However, here, the first height H1 is less than the second height H2.

Hence, the heat sink 700 may include a protrusion 710 in thermal contact with a semiconductor package 200. The protrusion 710 of the heat sink 700 may be in thermal contact with an upper surface of the semiconductor package 200. A lower surface of a peripheral region of the heat sink 700 corresponding to the stiffener 300 may contact an upper surface of the stiffener 300.

The foregoing illustrative embodiments are presented as teaching examples. Although a few embodiments have been described, those skilled in the art will readily appreciate that many modifications are possible without materially departing from the scope of the inventive concept as defined by the following claims.

What is claimed is:

1. A hybrid semiconductor device, comprising:
   an interposer substrate;
   a semiconductor package mounted on an upper surface of the interposer substrate, the semiconductor package including a package substrate, a semiconductor chip mounted on the package substrate, and a molding member on the package substrate covering a side surface of the semiconductor chip and exposing an upper surface of the semiconductor chip; and
   a stiffener disposed on the upper surface of the interposer substrate, wherein the stiffener is a walled structure that surrounds the semiconductor package, an inner surface of the walled structure faces towards and is spaced from an outer surface of the molding member, and an empty space exists from the inner surface of the walled structure and the outer surface of the molding member; and
   a heat sink having a flat lower surface in contact with the upper surface of the semiconductor package, the flat lower surface of the heat sink extending over and spaced above the wall structure of the stiffener.

2. The hybrid semiconductor device of claim 1, wherein an upper surface of the semiconductor chip is coplanar with an upper surface of the molding member.

3. The hybrid semiconductor device of claim 1, wherein the package substrate includes one of a coreless substrate and a core multilayered substrate.

4. The hybrid semiconductor device of claim 1, wherein the stiffener is a four-walled structure surrounding the semiconductor package and disposed in a peripheral region of the interposer substrate.

5. The hybrid semiconductor device of claim 1, wherein the interposer substrate includes a core multilayer substrate.

6. The hybrid semiconductor device of claim 1, wherein the semiconductor package further includes at least one of a first over passive device mounted on an upper surface of the package substrate and a first under passive device mounted on a lower surface of the package substrate.

7. The hybrid semiconductor device of claim 6, wherein the semiconductor package further includes package connection terminals disposed on the lower surface of the package substrate, and a height of the first under passive device is less than a height of the package connection terminals.

8. The hybrid semiconductor device of claim 7, further comprising:
at least one of a second over passive device mounted on the upper surface of the interposer substrate and a second under passive device mounted on a lower surface of the interposer substrate; and
interposer connection terminals disposed on the lower surface of the interposer substrate.

9. The hybrid semiconductor device of claim 8, wherein a pitch between the package connection terminals is less than a pitch between the interposer connection terminals.

10. The hybrid semiconductor device of claim 1, wherein the semiconductor package has a first height relative to an upper surface of the interposer substrate, and the stiffener has a second height relative to the upper surface of the interposer substrate and different from the first height.

11. A hybrid semiconductor device, comprising:
an interposer substrate;
a semiconductor package disposed on an upper surface of the interposer substrate, the semiconductor package including a package substrate, a semiconductor chip mounted on the package substrate, and a molding member on the package substrate covering at least a portion of the semiconductor chip;
a stiffener disposed on the upper surface of the interposer substrate, wherein the stiffener is a walled structure that surrounds the semiconductor package, an inner surface of the walled structure faces towards and is spaced from an outer surface of the molding member, and an empty space exists from the inner surface of the walled structure to the outer surface of the molding member;
a heat sink having a flat lower surface in contact with the upper surface of the semiconductor package, the flat lower surface of the heat sink extending over and spaced above the wall structure of the stiffener;
package connection terminals disposed between a lower surface of the semiconductor package and the upper surface of the interposer substrate; and
interposer connection terminals disposed on a lower surface of the interposer substrate,
wherein a pitch between the package connection terminals is less than a pitch between the interposer connection terminals.

12. The hybrid semiconductor device of claim 11, wherein an upper surface of the semiconductor chip is exposed by the molding member.

13. The hybrid semiconductor device of claim 11, wherein the package substrate is one of a coreless substrate and a core multilayered substrate.

14. The hybrid semiconductor device of claim 11, wherein the interposer substrate is a core multilayer substrate.

15. The hybrid semiconductor device of claim 11, wherein the semiconductor package has a first height relative to the upper surface of the interposer substrate, and the stiffener has a second height relative to the upper surface of the interposer substrate different from the first height.

16. An electronic device, comprising:
a main board;
an interposer substrate disposed on the main board;
a semiconductor package mounted on an upper surface of the interposer substrate, the semiconductor package including a package substrate, a semiconductor chip mounted on the package substrate, and a molding member on the package substrate covering at least a portion of the semiconductor chip;
a stiffener disposed on the upper surface of the interposer substrate, wherein the stiffener is a walled structure that surrounds the semiconductor package, an inner surface of the walled structure faces towards and is spaced from an outer surface of the molding member, and an empty space exists from the inner surface of the walled structure to the outer surface of the molding member;
package connection terminals interposed between a lower surface of the semiconductor package and the upper surface of the interposer substrate;
interposer connection terminals interposed between a lower surface of the interposer substrate and an upper surface of the main board; and
a heat sink having a flat lower surface in contact with the upper surface of the semiconductor package, the lower surface of the heat sink extending over and spaced above the wall structure of the stiffener.

17. The electronic device of claim 16, wherein a pitch between the package connection terminals is less than a pitch between the interposer connection terminals.

18. The electronic device of claim 16, wherein an upper surface of the semiconductor chip is exposed by the molding member.

19. The electronic device of claim 16, wherein the package substrate includes one of a coreless substrate and a core multilayered substrate.

20. The electronic device of claim 16, further comprising:
second passive devices mounted on at least one of the upper surface and the lower surface of the interposer substrate.

* * * * *